June 24, 1969 LE ROY D. HIRSCH 3,452,216

LOGIC CIRCUIT

Filed Dec. 13, 1965

WITNESSES:
Bernard R. Gregory
James F. Young

INVENTOR
LeRoy D. Hirsch
BY Dean Schron
ATTORNEY

United States Patent Office 3,452,216
Patented June 24, 1969

3,452,216
LOGIC CIRCUIT

Le Roy D. Hirsch, Baltimore, Md., assignor to Westinghouse Electric Corporation, Pittsburgh, Pa., a corporation of Pennsylvania Filed Dec. 13, 1965, Ser. No. 513,421
Int. Cl. H03k 19/22, 19/08, 19/12
U.S. Cl. 307—215 4 Claims

ABSTRACT OF THE DISCLOSURE

A logic gate with an output transistor and a multi-emitter input transistor. An isolation component in the form of a transistor has its collector connected to the base of the output transistor and its emitter connected to the collector of the multi-emitter input transistor. A fourth transistor having its base connected to the base of the multi-emitter transistor has its emitter connected to the base of the isolation transistor for supplying base current to the isolation and output transistors. Stored charges associated with the output transistor are afforded a low impedance discharge path through the collector-emitter circuit of the isolation transistor and a collector-emitter path of the input multi-emitter transistor.

Figure 1:
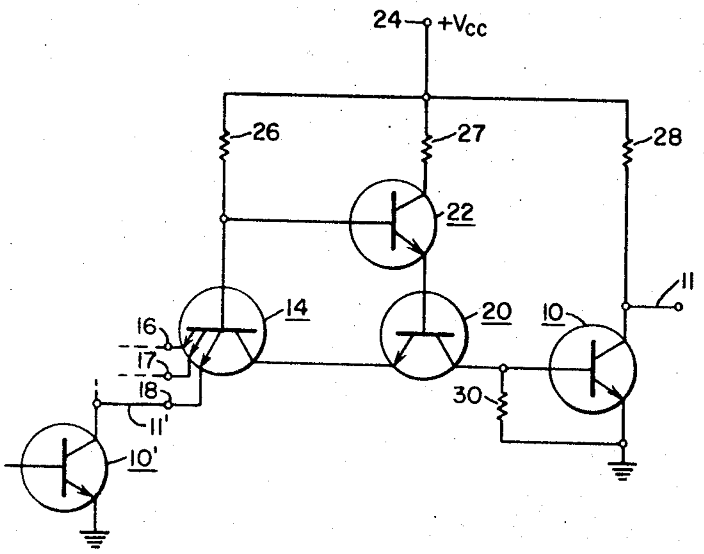

This invention in general relates to switching circuits, and more particularly to a transistor logic circuit.

A popular form of logic gate is the NAND (or NOR) gate which includes an input circuit for receiving input logic signals and an output transistor operable in an ON and OFF mode of operation depending upon the value of logic signals applied to the input of the gate. Basically, in a NAND gate, the output transistor will provide a ZERO output signal (transistor ON) when all of the input signals are ONES, and will provide a ONE output signal (transistor OFF) when one or more of the input signals is a ZERO. Generally, an isolation component is provided in the base circuit of the output transistor in order to insure proper isolation; that is, without the presence of the isolation component, a ZERO signal applied to the input of the logic gate could erroneously cause the output transistor to turn on. Additionally, the isolation component provides proper isolation against extraneous noise voltages which could tend to turn the transistor on, thus effecting proper operation. The isolation component generally is in the form of one or more semiconductor diodes, sometimes called offset diodes.

A certain amount of input capacitance is associated with the output transistor and when the output transistor is supplied with current, the effective input capacitance is charged. Additionally, when the output transistor is driven into saturation there is associated with the output transistor a stored base charge of minority carriers. In order for the transistor to turn off, this accumulation of stored charge in the base must be removed and the input capacitance must be discharged. It is desired that the stored charge be removed or "swept out" in order to have a fast turn-off of the transistor and accordingly, a faster operating logic gate.

When the output transistor switches from its ON to its OFF condition in response to one or more ZERO input signals applied to the logic gate, the stored charge is provided a path to ground through the isolation diode and through the input circuit. Where increased isolation and high noise immunity is desired, a plurality of isolation diodes are utilized thus providing the unwanted situation of slowing down discharge time due to increased impedance of the return path. Where the gate is fabricated as an integrated circuit, the isolation diodes slow down operation due to high shunt capacitance associated with the diodes.

It is therefore a primary object of the present invention to provide an improved high speed logic gate.

A further object is to provide an improved logic gate which is particularly well adapted to be fabricated as an integrated circuit.

Another object is to provide a logic gate wherein stored charge is quickly discharged to ground through low impedance components.

Briefly, in accordance with the above objects, there is provided a logic gate which includes an output transistor means and input transistor means, with the output transistor means providing output logic signals in response to input logic signals applied to the input transistor means. A first transistor has its collector-emitter current path connected between the input and output transistor means and affords a low impedance discharge path for eliminating stored charges associated with the output transistor means when switching between logic states. A second transistor is provided for supplying the first transistor and the output transistor means with a suitable base current for proper operation.

Figure 2:
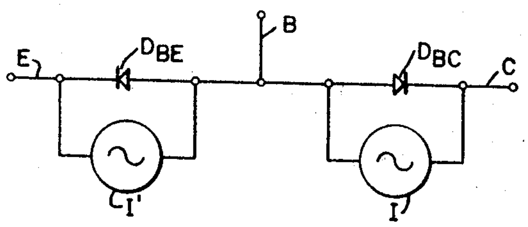

The above stated, as well as further objects and advantages of the present invention, will become apparent upon a reading of the following detailed specification taken in conjunction with the drawings in which:

FIGURE 1 is a schematic diagram illustrating a logic gate according to the present invention; and FIG. 2 is a schematic diagram illustrating a well-known equivalent circuit of a transistor.

FIG. 1 illustrates a NAND logic gate and includes an output transistor 10 for providing output logic signals on output terminal means 11 to one or more subsequent logic gates (fan-out), or circuits, in response to input logic signals applied to the input transistor means 14. The input transistor means 14 includes at least one collector-emitter current path such as provided by the multi-emitter transistor illustrated. Each emitter electrode of the multi-emitter transistor 14 is connected to respective input terminals 16, 17 and 18 to which is applied input logic signals from previous stages such as partially illustrated by an output transistor 10' and an output terminal means 11' from a previous stage.

A first transistor 20 has its collector-emitter current path connected between the input and output transistor means, and more specifically the collector of transistor 20 is connected to the base of output transistor 10 and the emitter of transistor 20 is connected to the collector of multi-emitter transistor 14.

Means for supplying base current to transistors 20 and 10 include a second transistor 22 having its base commonly connected with the base of multi-emitter transistor 14 and its emitter connected to the base of first transistor 20. Bias terminal 24 may be connected to a suitable source of operating potential $+V_{cc}$. The transistors, or some of the transistors of the logic gate may be connected to the bias terminal 24 in various ways. In FIG. 1, there is illustrated one way in which this may be accomplished and includes resistors 26, 27 and 28 connected between the bias terminal 24 and the base of the second transistor 22, the collector of the second transistor 22 and the collector of output transistor 10, respectively. Another resistor 30 is connected between the base and emitter of output transistor 10 to provide a current path to ground for leakage current of transistor 10 when in an OFF condition.

Before explaining the operation of the circuit of FIG. 1, reference should be made to FIG. 2 which illustrates a well-known equivalent circuit for a transistor. The leads labeled B, E and C represent the base, emitter and collector electrodes of a transistor; the diode $D_{BC}$ is representative of the base-collector diode of the transistor; the diode $D_{BE}$ is representative of the base-emitter diode of the transistor and the equivalent circuit analogy is completed by the provision of current generators I and I' in parallel with $D_{BC}$ and $D_{BE}$ respectively. The diode polarities illustrated are for an n-p-n type transistor such as those illustrated in FIG. 1.

Referring back to FIG. 1, consider a situation wherein input terminals 16, 17 and 18 each receive a ONE input signal. That is, a previous output transistor such as 10' is in its off condition and a high voltage representative of a logic ONE is being applied to the input terminal. With this situation, the multi-emitter transistor 14 is in an OFF condition and the second transistor 22 is being supplied with base current through resistor 26 and is turned on for supplying current to the base of first transistor 20. The current supplied by the second transistor 22 flows from the emitter thereof, through the base-collector diode (assuming positive to negative current flow) of the first transistor 20 and into the base of transistor 10 which is, accordingly, in an ON condition and providing a logic ZERO output at output terminal means 11.

At this time, there is no base-collector current flow through the multi-emitter transistor 14 since the emitter of the first transistor 20 is blocking current flow in that direction.

During this time, the input capacitance associated with the output transistor 10 is charged up and in addition, charge is being stored in the base of the output transistor 10. The stored charge must be removed in order for output transistor 10 to turn off and must be removed very quickly in order to have a fast operating logic gate. The removal is accomplished by the first transistor 20 in conjunction with the multi-emitter transistor 14. More explicitly, suppose that one of the input signals switches to a ZERO, as for example, when a transistor 10' switches to its conducting state. With a ZERO input signal, the multi-emitter transistor 14 is supplied with base current to turn on and afford a collector-emitter current path. The voltage condition at the base of the second transistor 22 is such that it turns off and stops providing base current to the first transistor 20. The previously provided base current has charged up the base-collector diode of the first transistor 20 since the diode can be considered to have an associated capacitance which charges up when the diode is forward biased. Initially, a portion of this total charge, herein called $Q_{BC}$ discharges through the base-emitter junction of the first transistor 20 and turns on, or forward biases its base-emitter diode. Since the collector geometry and the emitter geometry of a transistor are not identical, the charge transferred from the base-collector diode to the base-emitter diode and herein called $Q_{BE}$ will be somewhat less than the original total charge $Q_{BC}$. Since a current path is established from the collector to emitter of the multi-emitter transistor 14, it affords a path for discharging the charge associated with the first transistor 20. When the base-emitter diode of the first transistor 20 is forward biased, the remaining charge on the base-collector diode also flows through the forward biased junction. Since a flow of charge is considered to be a current, a transient transistor action is taking place wherein the first transistor 20 can support current flow from its collector to its emitter. The excess base charge, and charged up input capacitances of output transistor 10 are then discharged through the collector-emitter current path of the first transistor 20 and through a collector-emitter path of the multi-emitter transistor 14. The amount of charge which can be removed from output transistor 10 by the first transistor 20 will be determined by the $\beta$(common emitter forward current gain) of the transistor 20 and the difference in base-collector and base-emitter charges; that is, the first transistor 20 can support a total charge from output transistor 10 of $\beta(Q_{BC}-Q_{BE})$.

Thus it is seen that the excess charge associated with output transistor 10 flows through two low impedance paths provided by the collector-emitter current path of the first transistor 20, and a collector-emitter current path of multi-emitter transistor 14. This action is very rapid and, in fact, an operative NAND gate built in integrated circuit form and according to the teachings herein, exhibited an average switching speed of 7 nanoseconds, with a fan-out of 1 and a supply voltage of 5 volts.

When the input signals to input terminals 16, 17 and 18 again becomes all ONES, the base of multi-emitter transistor 14, and consequently the base of the second transistor 22 rises to a point where the second transistor 22 turns on and again supplies base current to the first transistor 20 and output transistor 10 through the base-collector diode of the first transistor 20 in series with the emitter of the second transistor 22.

Although the present invention has been described with a certain degree of particularity, it is to be understood that various modifications in the combination and arrangement of parts may be resorted to without departing from the spirit and scope of the invention.

I claim as my invention:

1. A logic circuit comprising:
(A) output transistor means for providing an output logic signal;
(B) a multi-emitter transistor input means for receiving input logic signals;
(C) a first transistor having its emitter connected to the collector of said multi-emitter transistor, and its collector connected to the base of said output transistor means;
(D) a second transistor for controlling input current to said output transistor means through said first transistor when said input logic signals have predetermined values.

2. A logic circuit according to claim 1 wherein
(A) base current for the output transistor means is supplied through the base-collector diode of the first transistor in series with the emitter of the second transistor.

3. A logic circuit according to claim 1 wherein
(A) the base of the second transistor is commonly connected with the base of the multi-emitter transistor.

4. A logic gate according to claim 1 wherein
(A) when the second transistor stops supplying current due to the occurrence of predetermined input signals, a portion of the charge associated with the base-collector diode of the first transistor discharges through the base-emitter diode thereof to render it conductive, and wherein;
(B) said first transistor has a forward current gain $\beta$ of a value sufficiently high to support discharge, through its collector-emitter current path, of the stored charge associated with the output transistor, where the total supportable charge is equal to $\beta$ times the remaining portion of charge associated with said base-collector diode.

References Cited

UNITED STATES PATENTS

| | | | |
|---|---|---|---|
| 3,233,125 | 2/1966 | Buie | 307—215 |
| 3,287,577 | 11/1966 | Hung et al. | 307—215 |
| 3,329,835 | 7/1967 | D'Agostino | 307—215 |
| 3,351,782 | 11/1967 | Narud et al. | 307—299 X |
| 3,378,695 | 4/1968 | Marette | 307—213 X |

DONALD D. FORRER, *Primary Examiner.*

U.S. Cl. X.R.

307—214, 218, 299